United States Patent

Grabmaier

[15] 3,649,351

[45] Mar. 14, 1972

[54] METHOD OF PRODUCING EPITACTIC LAYERS OF ELECTRICAL-INSULATION MATERIAL ON A CARRIER BODY OF SEMICONDUCTOR MATERIAL

[72] Inventor: Josef Grabmaier, Unterhaching, Germany

[73] Assignee: Siemens Aktiengesellschaft, Berlin, Germany

[22] Filed: Sept. 25, 1969

[21] Appl. No.: 860,943

[30] Foreign Application Priority Data

Sept. 30, 1969 Germany ........................P 17 89 064.1

[52] U.S. Cl. ..............................117/201, 117/120, 23/301 SP

[51] Int. Cl. ..............................B44d 1/18, H01l 7/40

[58] Field of Search ..................117/201, 106 A; 148/174; 23/301

[56] References Cited

UNITED STATES PATENTS

| | | | |
|---|---|---|---|
| 3,341,361 | 9/1967 | Gorski | 117/120 |
| 3,411,946 | 11/1968 | Tramposch | 117/201 |

*Primary Examiner*—William L. Jarvis

*Attorney*—Curt M. Avery, Arthur E. Wilfond, Herbert L. Lerner and Daniel J. Tick

[57] ABSTRACT

A method of producing integrated semiconductor circuits, on electrically insulated foreign substrates, whereby the connection between the semiconductor material and the foreign substrate is effected through an epitactic growth process. The semiconductor crystal wafer, which is provided for the subsequently produced circuit, is used as the original substrate body for an epitactic coating, and the insulating layer, which defines the foreign substrate, is epitactically deposited thereupon.

3 Claims, 2 Drawing Figures

Figure 1:
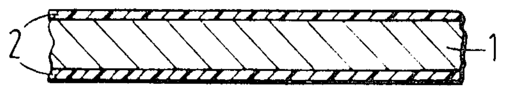

METHOD OF PRODUCING EPITACTIC LAYERS OF ELECTRICAL-INSULATION MATERIAL ON A CARRIER BODY OF SEMICONDUCTOR MATERIAL

The invention relates to a method to produce integrated semiconductor circuits on electrically insulated foreign substrates, whereby the connection between the semiconductor material and the foreign substrate is effected through an epitactic growth process.

To obtain integrated semiconductor circuits on electrically insulated foreign substrates, such as saphire or spinel, it is customary to produce the semiconductor material layers whereon the circuits are subsequently manufactured by producing the semiconductor material from the gaseous phase, by an epitactic process. Due to the very high-melting point of silicon, only high melting substances can be employed as a substrate material. However, no high melting substrate materials are available at present, which can meet all necessary requirements, with respect to crystal perfection, thermal and mechanical stability and, last but not least, to lattice structure, in order to afford a perfect epitactic silicon coating. Epitactic coating is a coating process that is free of considerable growth disturbances.

By contrast, it is possible, today, to produce semiconductor material, as e.g., silicon which has few or even no dislocations whatever. Moreover, the polishing and etching techniques today are such as to "thin" semiconductor crystal wafers down to a diameter of 40 mm. and a thickness of 20 microns, with good surface parallelism. These dimensions are necessary for the production of integrated semiconductor circuits.

My invention is a result of the aforedescribed factors. My invention provides a method wherein the carrier body for the epitactic coating is defined by the semiconductor crystal wafer which is intended for the circuit, to be subsequently produced, whereupon the insulating layer, which defines the foreign substrate, is applied by the epitactic method. Thus, the employed substrate is the crystal wafer itself and the foreign substrate material is epitactically precipitated, thereon.

According to a further development of the invention, the epitactic application of the insulating layer is effected by immersing the original substrate body into a melt of the appropriate insulating material, and by slowing pulling of the substrate body from the melt. The pulling velocity is preferably 50 to 100 mm./h.

Another embodiment proposes to produce the insulating layer by sublimation, in a vacuum, on the semiconductor crystal wafer. The insulation material can also be precipitated from the gaseous phase.

Suitable semiconductor materials are silicon, germanium or $A^{III}B^{V}$ compounds, such as gallium arsenide.

According to a particularly preferred embodiment, the insulating layer is comprised of calcium fluoride.

The method of the invention makes it possible to produce multiple layers. Thus, for example the original substrate is a silicon crystal wafer, whereon, a thin calcium fluoride layer is epitactically precipitated, as an intermediate layer, and another silicon crystal layer is precipitated upon said intermediate layer, with the aid of another epitactic growth process.

The method of the invention affords the possibility of producing thin layer semiconductor components, upon foreign substrates and, if necessary, to construct said components by employing monocrystalline multiple layers. The crystal systems obtained according to the invention are characterized by a high crystal perfection of the semiconductor layer, wherein the component structures are produced according to known method steps used in the semiconductor art.

The invention will be disclosed in greater detail by referring to the drawings in which:

FIG. 1 shows the body produced by the invention; and

Figure 2:
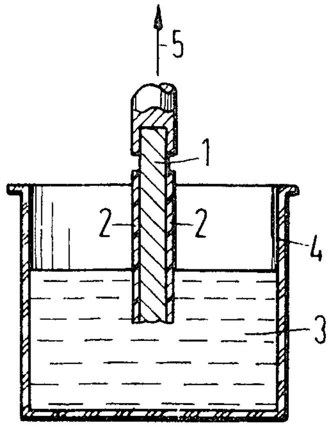

FIG. 2 schematically shows one way of producing the body.

FIG. 1 shows a simple layer sequence, which occurs by the invented method. The substrate body 1 is comprised of a silicon monocrystal wafer with a layer calcium fluoride 2 precipitated by epitaxy upon both sides of said substrate body. Of necessity, the epitactic precipitation results in an insulating layer, on the bottom of the substrate body. The insulating layer can be removed by etching or by appropriate mechanical methods.

FIG. 2 schematically illustrates a device for performing the invention. 3 indicates the calcium fluoride melt, located in a crucible 4, wherefrom by pulling at a velocity of 50 mm./h., in the direction of arrow 5, and by using a monocrystalline silicon crystal wafer 1, as a seed, a fluoride layer 2 is precipitated, by epitaxy.

I claim

1. A method of producing integrated semiconductor circuits, situated on electrically insulated foreign substrates, whereby the connection between the semiconductor material and the foreign substrate is effected through an epitactic growth process, wherein the semiconductor crystal wafer, which is provided for the subsequently produced circuit, is used as the original substrate body for an epitactic coating, and the insulating layer, which defines the foreign substrate, is epitactically deposited thereupon, dipping said original substrate body into a melt of appropriate insulating material and by slowly pulling of the substrate body from said melt.

2. The method of claim 1, wherein calcium fluoride ($CaF_2$) is the insulating material.

3. The method of claim 1, wherein a pulling velocity of 50 to 100 millimeters per hour is used.

* * * * *

PO-1050
(5/69)

UNITED STATES PATENT OFFICE
CERTIFICATE OF CORRECTION

Patent No. 3,649,351 Dated March 14, 1972

Inventor(s) JOSEF GRABMEIER

It is certified that error appears in the above-identified patent and that said Letters Patent are hereby corrected as shown below:

In the heading to the printed specification, the Foreign application Priority Date should read --Sept. 30, 1968-- and not Sept. 30, 1969.

Signed and sealed this 9th day of January 1973.

(SEAL)
Attest:

EDWARD M.FLETCHER,JR.
Attesting Officer

ROBERT GOTTSCHALK
Commissioner of Patents